United States Patent [19]

Washizuka et al.

[11] 4,074,118
[45] Feb. 14, 1978

[54] CALCULATOR CONSTRUCTION

[75] Inventors: Isamu Washizuka, Kyoto; Shintaro Hashimoto, Shiki; Saburo Katsui, Nara, all of Japan

[73] Assignee: Sharp Kabushiki Kaisha, Osaka, Japan

[21] Appl. No.: 576,834

[22] Filed: May 12, 1975

Related U.S. Application Data

[63] Continuation of Ser. No. 403,857, Oct. 5, 1973, abandoned.

[30] Foreign Application Priority Data

Oct. 6, 1972 Japan .................................. 47-100996
Apr. 24, 1973 Japan .................................. 48-46929

[51] Int. Cl.$^2$ .............................................. G06F 7/38
[52] U.S. Cl. ..................................... 364/712; 361/380
[58] Field of Search ........................... 235/152, 156; 317/101 A, 101 R; 174/68.5, 117 PC

[56] References Cited

U.S. PATENT DOCUMENTS 3,676,656  7/1972  Schmidt .................................. 235/156
3,819,921  6/1974  Kilby et al. ............................. 235/156

OTHER PUBLICATIONS

R. K. Johnson, Applicance, Apr. 1972, Ragen Produces Mini-Calculator, pp. 41-44.

*Primary Examiner*—Charles E. Atkinson
*Attorney, Agent, or Firm*—Birch, Stewart, Kolasch & Birch

[57] ABSTRACT

An electronic calculator disclosed herein is comprised mainly of a multi-digit liquid crystal display unit, a mechanical contact type keyboard unit and a semiconductor circuit unit including a computation circuit, logical control circuit, storage circuit, program memory circuit, etc., these units being all incorporated on a single plate of electrically insulating material. One of a pair of spaced apart electrically insulating plates forming a capacity for the liquid crystal composition is of a length sufficient to support all the constitutional units, which has two major surfaces one for supporting the keyboard unit and the other for supporting the semiconductor circuit unit. Connection between oppositely disposed keyboard unit and semiconductor circuit unit is accomplished by any conventional method, for example, multi-terminal connector, conductive material printing, through holes, wire bonding and so on.

14 Claims, 6 Drawing Figures

CALCULATOR CONSTRUCTION

This is a continuation of application Ser. No. 403,857 filed Oct. 5, 1973 and now abandoned.

This invention relates generally to an electronic calculator, and more particularly to a calculator construction and fabrication of an electronic calculator.

In accordance with the prior art for calculator architecture, constitutional function units thereof, namely, a display unit employing fluorescence indicator tubes, light-emitting diodes, etc., a semiconductor circuit unit including various arithmetic and logic circuit elements, and a key input unit for manually introducing functional commands into the semiconductor circuit unit, are clearly distinct components and the individual components or units are connected together by a number of lead wires. Then, the components or units coupled in such manner are housed in a single case, thereby completing fabrication of the well-constructed calculator. Although such fabricated calculator system can be previewed as an unification system from the outside, these components in practice are physically independent of each other except for electrical bonding area. Furthermore, an unnecessary area is required due to the connections between the individual components depending on wiring and soldering technology. For these reasons, difficulties have been encountered in arriving at an electronic calculator construction having not only the required reliability associated with electrical bonding but also small size to be practical for use in a battery powered calculator. In addition, the manufacturing processes therefor are complex and not suited for mass production.

It is therefore a primary object of this invention to provide a novel electronic calculator which fulfills requirements for a substantial reduction in size, an improvement in reliability and great simplicity in fabrication.

In accomplishing this object, there is provided, in accordance with this invention, an electronic calculator wherein a display unit is constituted by a multi-digit liquid crystal unit having a pair of spaced apart dielectric plates at least one of which includes a portion extending outside the display unit to support other function units. A semiconductor circuit unit and a keyboard unit are mounted directly on the same dielectric plate, thereby incorporating all the function units necessary for calculator implementation into a single chip or substrate.

The invention will be more readily understood from the following description of preferred embodiments thereof given by way of example with reference to the accompanying drawings, in which.

Figure 1:
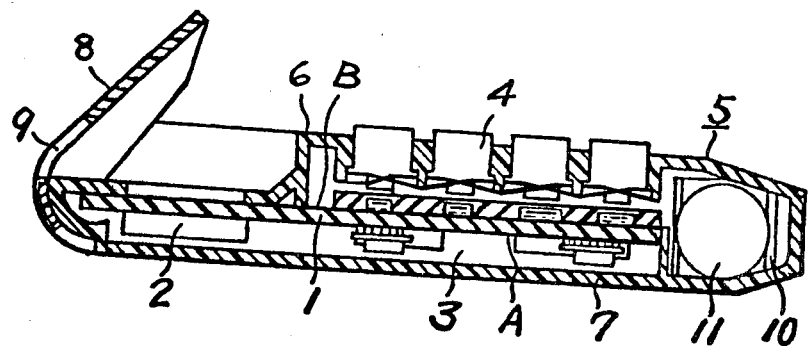
FIG. 1 is a sectional side view of an electronic calculator embodying the principles of the present invention.

Referring now to FIG. 1 illustrating one form of an electronic calculator embodying this invention, a substrate 1 is constituted by an extending portion of an electrode supporting plate within a liquid crystal display unit 2 and made of dielectric material, for example, such as glass, ceramic, plastics and so forth. A semiconductor circuit unit 3 containing various circuit elements and interconnections therebetween is directly mounted on a major surface or rear surface A of the substrate 1 while a keyboard unit 4 is directly mounted on the other major surface or front surface B. The liquid crystal display unit 2, the semiconductor circuit unit 3 and the keyboard unit 4 which are unified as a single component on the same plate 1, are accommodated in a package or casing 5 of plastics and the like. The package 5 is comprised of an upper wall 6, a lower wall 7 and a hood 8 for opening and closing an indication surface of the display unit 2 when necessary. A plurality of openings are formed in the upper wall 6 to install key tops therein.

The hood 8 may rotate about coupling of the upper and lower walls 6, 7 within a range of a predetermined angle (e.g. 45°) and, in the illustrated embodiment, is provided with a window or transparent portion 9 in a manner to ensure that ambient light beams are enabled to irradiate the indication surface of the display unit 2 when in the open state. The transparent portion 9 preferably consists of plastic material in lens form. Surrounded by the upper and lower walls 6, 7, at one side of the calculator system, is a cavity 10 to accommodate a power cell 11 therein. In order to reduce power dissipation, provision is made for automatically enabling power supply to the circuit unit 3 and the display unit 2 when the hood 8 is in the open state and automatically inhibiting power supply when the desired arithmetic operations are completed and the hood 8 is closed. This provision is accomplished by installation of a switch (not shown) associated with opening and closing movements of the hood 8 for opening and closing the circuit to power cell 11.

Details of the liquid crystal display unit 2, the semiconductor circuit unit 3 and the keyboard unit 4 generally illustrated in FIG. 1 will be clearer from the following detailed description with reference to FIGS. 2 through 5 inclusive thereby to facilitate understanding of the calculator implementation of this invention.

Figure 2:
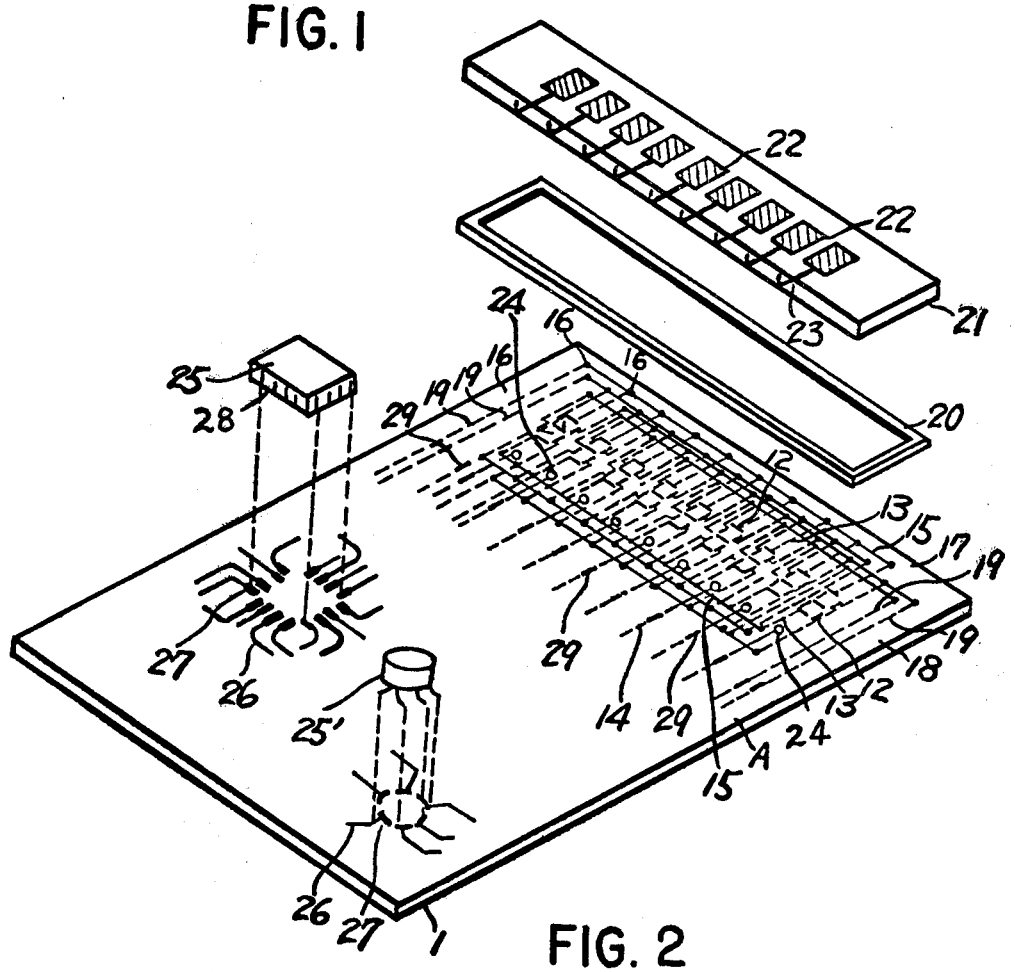
FIGS. 2 and 3 are exploded perspective views of the electronic calculator of FIG. 1.

FIG. 2 is an exploded perspective view illustrating the liquid crystal display unit 2 and the semiconductor circuit unit 3 directly formed on the rear surface A of the substrate 1. As previously described, the multi-digit display unit 2 comprises a plurality of liquid crystal display elements of the known construction which has, for example, a layer of nematic liquid crystal composition of a type that scatters light due to turbulence in the layer created by the application of a voltage across the layer. On the transparent substrate 1 of glass, etc. is partically formed individual segment electrodes 12 each consisting of transparent conductive film such as $SnO_2$, $In_2O_3$ together with electrode leads 13. In this manner, the substrate 1 is also constituted as the transparent electrode (supporting) plate for the liquid crystal display unit.

Interconnections 14 between the liquid crystal display unit 2 and the circuit unit 3 are made on the desired interconnection pattern over the whole surface of the substrate 1 by use of thick film printing technology known in the art. It is preferable that multi-layer interconnections (two layers) 15 are employed with intervention of dielectric material therebetween to increase the density of interconnection. These multi-layer interconnections can be seen from the outside because of the intervention of dielectric material being of, for example, semitransparent low melting-point glass. Connection holes 16 serve in the connection between the upper and lower films within the multi-layer interconnection. It is, in fact, with difficulty that the electrode leads 13 for the individual segment electrodes 12 are arranged side by side to extend in only one direction in terms of the alignment and the number of the segment electrodes 12. To this end, a space 17 is disposed above the display unit area, in which the electrode leads 13 are formed and tied to the semiconductor circuit unit 3 as they extend through both sides 18 of the display area. The interconnections extending through both sides are formed of transparent conductive film.

After such formation of the individual segment electrodes 12 and interconnection 14 (interconnections within the circuit unit 3 will be described later) on the substrate 1, a glass plate 21 is attached and adhered through a spacer 20 in a position corresponding to the display unit area. The substrate 1 having the segment electrodes 12 formed thereon serves as the first electrode supporting plate while the glass plate 21 serves as the second electrode supporting plate. Conventional A1 vapor deposition and other methods can be used in applying a common reflective electrode 22 for each digit display element on the glass plate 21. The first and second electrode plates 1, 21 and the spacer member 20 together form a cavity for the nematic liquid crystal composition. The liquid crystal display unit 2 of the reflection type is provided in this way. The spacer member 20 may be either dielectric material such as mica, polyethylene terephthalate film, or bonding agent such as glass frit. The common electrodes 22 deposited on the second plate 21 extend to the predetermined interconnections 15 on the substrate 1 through electrode leads 23 on the glass plate 21 and silver paste on connection pins 24. In the illustrated embodiment of this invention, the electrode leads for the liquid crystal display unit 2 are all introduced on the same substrate 1 and are appropriately connected to other various components or units. The liquid crystal display unit provides, for example, an eight-digit digital indication as well as indicating sign symbols +, − or constant calculation symbols K at the most right (or left) position. With such an arrangement, the display unit 2 will provide a visual indication of operation results in response to enabling signals from the semiconductor circuit unit 3.

On the other hand, the semiconductor circuit unit 3 is comprised of several LSI (large-scale integrated circuit) elements 25, 25' and interconnections 26 formed in the desired pattern on the substrate 1 with the thick layer printing technology. Provision for the interconnections 26 can be accomplished by printing and sintering gold paste on the substrate 1. Also, multi-layer interconnections may be employed if necessary. The LSI elements 25, 25' are installed on the substrate 1 by soldering technology in a manner that the individual leads thereof are connected to previously plated solder layers 27 which in turn are connected to the interconnections. More specifically, in contrast with the conventional LSI packages, the LSI element 25 illustrated in FIG. 2 has now-projecting signal leads 28 which are previously coated with solder. The LSI element 25 is first deposited on the substrate 1 in such a way that the individual leads 28 are in physical contact with the solder layers 27. Joint points are coated with soldering paste and heated with soldering iron so that the solder is well melted adjacent about the joint points to provide electrical sound connections therebetween. A sequence of these treatments needs lesser amount of solder and allows for easy soldering connections.

The interconnections associated with the liquid crystal display unit 2 and the semiconductor circuit unit 3 are formed at the same time by utilizing the thick-layer printing technology with gold paste or other materials. It is, therefore, not necessary to form these interconnections in separate processes. If the thick layer printing procedure is performed after adhesion of low melting-point glass frits on the substrate 1, then very tight coupling will result between the printed interconnection layers and the substrate. In addition, the interconnection layers can be sealed with low melting-point glass for ensuring improvements in electrical isolation and wear resistivity. Check terminals 29 are provided for sensing signals which occur in the semiconductor circuit unit 3.

Figure 3:
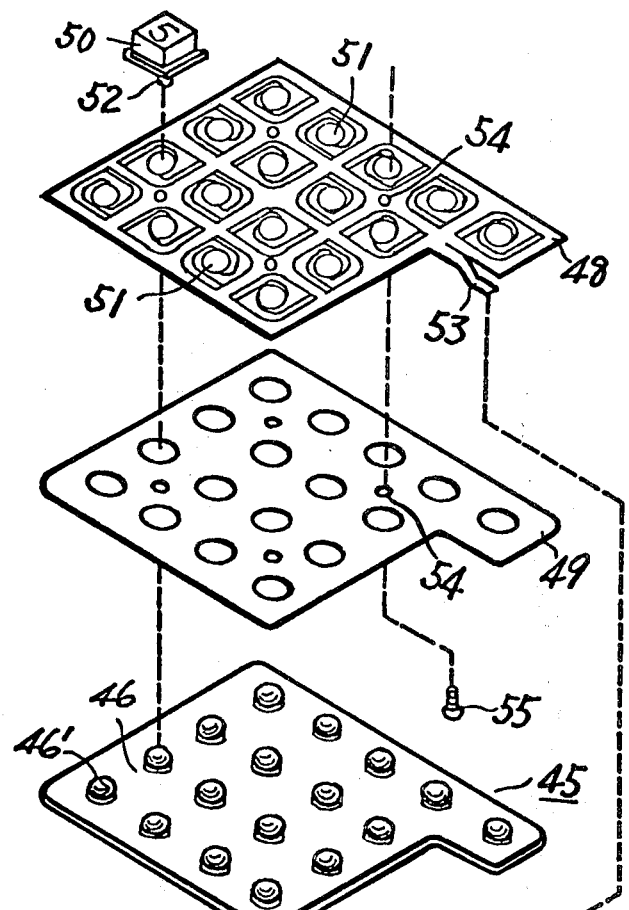
Figure 3:
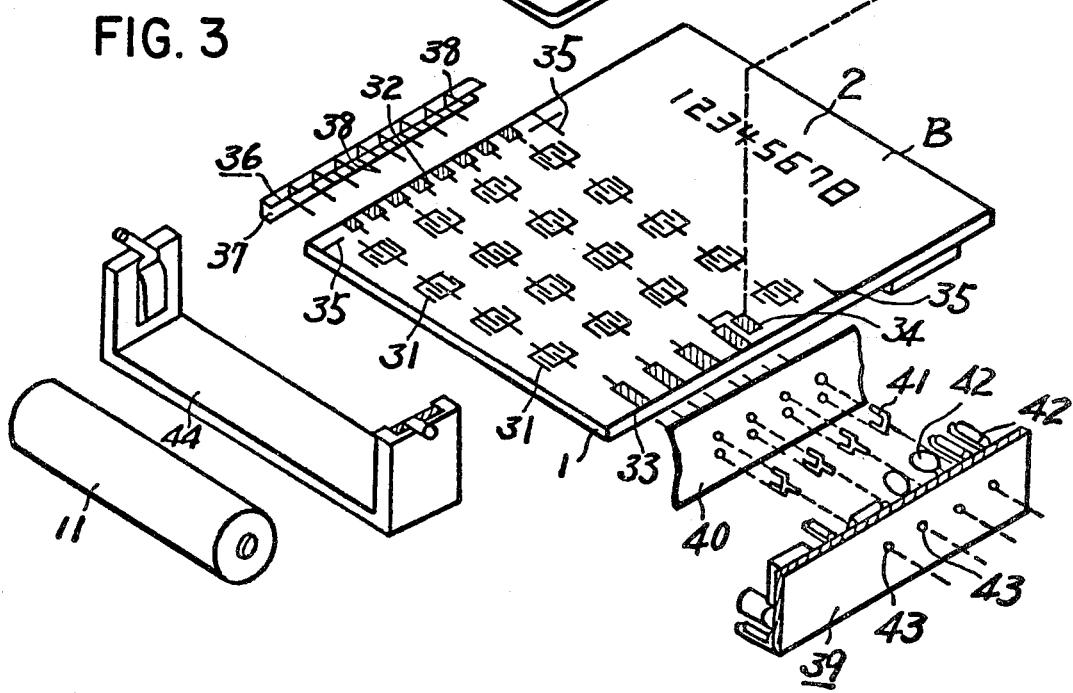
Figure 4:
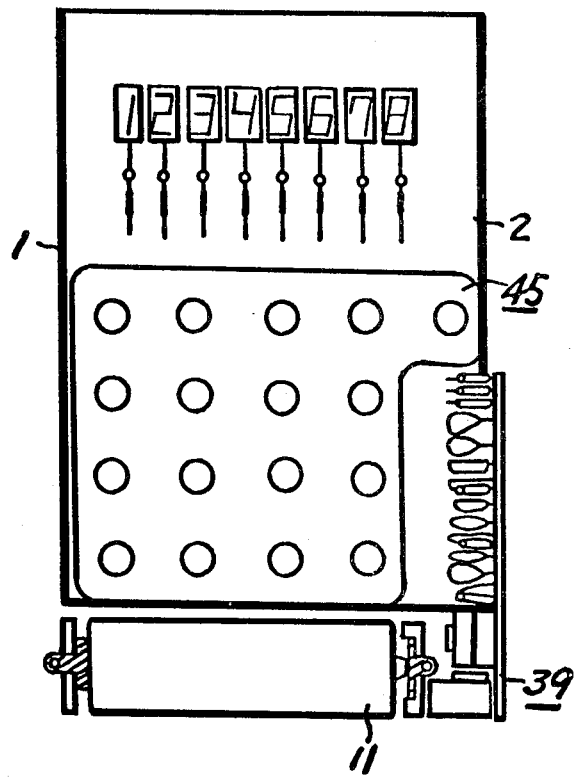
FIG. 4 is a plan view of the electronic calculator in a certain manufacturing process.

FIG. 3 is an exploded perspective view illustrating the construction and arrangement of the keyboard unit 4 directly formed on the front surface B of the substrate 1. The keyboard unit 4 illustrated is comprised of comb-shaped electrodes 31 for key switches or contacts formed in accordance with the teachings of the thick layer printing technology using gold paste, silver paste or other proper materials, a plurality of signal terminals 32 for key coupling to the circuit unit 3, several power accepting terminals 33 and ground terminals 34 for a common spring plate to be described later. Guide lines may be written in the course of the thick layer printing treatment for the deposition of contact electrodes 31 to assist installation of rubber switch contacts to be described later on the substrate 1. Needless to say, the contact electrodes 31, the signal terminals 32 and the power accepting terminals, although not shown in the drawing, are connected together by the thick layer printing technology, and directly formed on the substrate together with the ground potential terminal 34 and the guide lines 35 at the same time after the printing and sintering procedures. One way of forming connections between individual units directly constituted by both surfaces A, B of the substrate 1 is to employ a multi-pin connector 36 comprised of a dielectric film 36 and a set of "U" shaped shunting pins 38 each being in contact with the individual signal terminals 32. Provision of such a connector 36 enables arithmetic instruction signals originating in response to key depression to be transferred to the semiconductor circuit unit 3 directly formed on the rear surface A of the substrate 1 via the individual shunting side pins 38. It will be noted that conventional other methods, for example, such as conductive material printing, through holes, wire bonding may be applied to do so. A power supply circuit (in this example, DC-DC converter) unit board 39 is positioned adjacent about a certain side of the substrate 1 in view of the requirement for miniaturization of home-use calculators. This board 39 carrier with various power circuit parts or elements associated with the cell 11 is secured through a coupling arrangement including a dielectric film 40, and conductive pins 41 inserted in holes 43 in the board 39, such that the specified points in the power supply circuit are electrically coupled to the power accepting terminal 33 on the front surface B and the predetermined points on the rear surface A. Solder welding is carried out about the holes 43 for coupling between the pins 41 and the power board 39. In the illustrated embodiment, one end portion of the power board 39 extends outside from the substrate 1 and thus the cavity 10 in which the power cell 11 and holder 44 are housed is formed by a space about such extension portion of the board 39. The relative positions of the cell 11 and the power board 39 with respect to the substrate 1 will be best understood from FIG. 4, wherein the key electrode areas are all covered with a single rubber plate 45.

Figure 5:
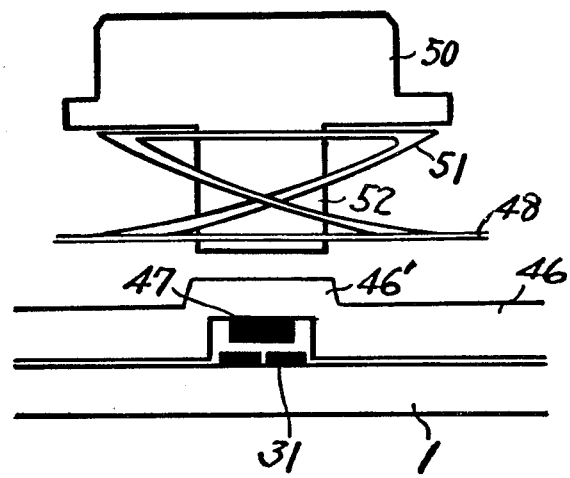
FIG. 5 is a sectional view of a keyboard unit employed in the electronic calculator.

The rubber plate 45 which comprises a dielectric rubber base 46 having a predetermined number of dome-shaped projections 46' and conductive rubbers 47 tightly affixed to the inner wall of the projections 46', cooperates with the comb-shaped electrodes directly formed on the front surface B to constitute a predetermined number of key switches of the keyboard unit 4. The rubber plate 45 is precisely positioned by utilizing the guide lines 35 and directly adhered to the major surface B of the substrate 1 except in the area of the dome shaped projections 46'. In addition to these parts or elements, the keyboard unit 4 includes a common spring plate 48, a common reinforcing plate 49 and key tops 50. The common spring plate 48 is made of thin and elastic steel plate and the spring areas 51 thereof are respectively of spiral configuration having a pair of pivoting axes to afford snap actions thereto. Each key top 50 has a downwardly directed leg 52 which is movably inserted in a central hole within the spring area, as illustrated in FIG. 5.

The individual spring areas 51 are held at positions corresponding to the dome shaped projections 46' of the rubber plate 45. With this arrangement, when a certain key top 50 is manually operated, the corresponding dome shaped projection 46' is pressed downward by the leg 52 with spring snap action, so that the pair of comb shaped electrodes 31 is electrically shunted with interposition of the conductive rubber 47. Afterward, if the key top 50 is free from manual depression, it is returned to the original position under the snap action and the pair of key electrodes 31 comes to the non-shunted state. The reason for employing the key springs incorporated as a single component rather than separate components is to prevent electrostatic charge stored in human body form being transmitted and introduced to the semiconductor circuit unit 3 through a key arrangement. To this end, a connection is provided between a ground portion 53 of the spring plate 48 and the ground terminal 34 on the substrate 1. The pivoting axes within the spring areas 51 are oriented in different directions in order that the extremely thin spring plate 48 is not curved in one direction. The common spring plate 48 and the reinforcing plate 49 are secured together to the upper cabinet 6 by screws 55 or the like passing through holes 54.

As noted earlier, in the illustrated example of this invention, the display unit 2, the semiconductor circuit unit 3 and the keyboard unit 4 are all directly formed on the major surfaces of the substrate 1. Upon depression of the key top 50 the arithmetic instruction signal originating from the key electrode pair 31 is entered into the semiconductor circuit unit 3 on the rear of the substrate via the shunting connector 36 to carry out the desired arithmetic operation. The result of the operation will be visually indicated due to the turbulence created within the nematic liquid crystal upon the application of a voltage between the liquid crystal display electrodes.

We claim:
1. An electronic calculator comprising:
   a pair of substantially planar dielectric substrates constructed and arranged to define a cavity therebetween, one of said substrates being larger than the other in the provision of an extension of said one substrate beyond said cavity;
   a liquid crystal display unit, a liquid crystal composition being contained in said cavity, said liquid crystal display unit including electrode means formed on said dielectric substrates;
   semiconductor circuit means including at least a computation function circuit having an input and an output, said semiconductor circuit means being directly mounted on said extension of said one substrate, said computation function circuit output being coupled to said electrode means of said display unit; and
   keyboard switch means for feeding data into said calculator having stationary switch contacts directly formed on said extension of said one substrate, said stationary switch contacts being electrically coupled to the input of said computation function circuit.
2. The electronic calculator of claim 1 wherein said semiconductor circuit means is mounted on one surface of said extension of said substrate and said stationary switch contacts of said keyboard switch means are formed on the other surface of said extension of said substrate.
3. The electronic calculator of claim 1 wherein said liquid crystal display unit is of the multi-digit type including a plurality of digit cells, each of said digit cells including a pair of electrodes and a liquid crystal composition between the electrodes in said cavity.
4. The electronic calculator of claim 1 wherein said keyboard switch means includes moveable contacts for selectively engaging said stationary contacts.
5. The electronic calculator of claim 4 wherein said key switches are of the push button type, including means for biasing the moveable contacts thereof normally out of engagement with said stationary contacts, said means for biasing comprising a single spring plate means having formed therein spring action areas in alignment with each of said key switches.
6. The electronic calculator of claim 1 wherein the cavity is defined by the hollow central portion of a spacer unit sandwiched between the pair of substantially planar dielectric substrates.
7. The electronic calculator of claim 1 wherein the keyboard switch means includes a plurality of key switches associated with said stationary switch contacts directly formed on said extension of said one substrate, each of said key switches being operatively associated with at least one of said stationary switch contacts.
8. The electronic calculator of claim 5 wherein said spring plate means is electrically conductive and is coupled to ground.
9. The electronic calculator of claim 5 wherein each of said spring action areas is of spiral configuration with a pair of pivoting axes.
10. An electronic calculator comprising:
    a single continuous substrate supported within the interior of said electronic calculator;
    an integrated circuit unit directly mounted on said substrate, said integrated circuit unit containing at least a computation circuit;
    a keyboard unit including a plurality of key switches each key switch comprising a fixed contact directly deposited on the substrate and a moveable contact operatively associated with said fixed contact serving to enter into said calculator digit and function specifying information on which a calculation is performed by said computation circuit;

a display unit having a series of display elements, each element comprising first and second electrodes at least one of which is directly deposited on the substrate;

a first connection directly deposited on said substrate and disposed between said keyboard unit and said integrated circuit unit for transmission of said information from said keyboard unit to said integrated circuit unit;

and a second connection directly deposited on said substrate and disposed between said integrated circuit unit and said display unit for displaying computation results derived from said integrated circuit unit on said display unit; whereby said substrate provides a structural support for all said integrated circuit unit, said keyboard unit, said display unit, said first connection and said second connection.

11. The electronic calculator of claim 10 wherein said single continuous substrate comprises a dielectric material.

12. The electronic calculator of claim 11 said dielectric substrate having a first major surface and a second major surface, said integrated circuit unit being directly mounted on said first major surface and said fixed contact of each of said plurality of key switches being directly deposited on said second major surface.

13. An electronic calculator comprising:

a pair of substantially planar dielectric substrates constructed and arranged to define a cavity therebetween, one of said substrates being larger than the other in the provision of an extension of said one substrate beyond said cavity;

a liquid crystal display unit, a liquid crystal composition being contained in said cavity, said liquid crystal display unit including electrode means formed on said dielectric substrates;

semiconductor circuit means including at least a computation function circuit having an input and an output, said semiconductor means being directly mounted on said extension of said one substrate;

keyboard switch means for feeding data into said calculator having stationary switch contacts directly formed on said extension of said one substrate;

first connection means disposed between said stationary switch contacts and the input of said computation function circuit for transmission of information from said keyboard switch means to said conductor circuit means; and second connection means disposed between the output of said computation function circuit and the electrode means of the display unit for displaying couputation results derived from said computation function circuit on said liquid crystal display unit.

14. An electronic calculator comprising:

a pair of substantially planar dielectric substrates constructed and arranged to define a cavity therebetween, one of said substrates being larger than in the other in the provision of an extension of said one substrate beyond said cavity;

an integrated circuit directly mounted on said extension of said one substrate, said integrated circuit unit containing at least a computation circuit having an input and an output;

a keyboard unit including a plurality of key switches, each switch comprising a fixed contact directly deposited on said extension of said one substrate and a moveable contact operatively associated with said fixed contact serving to enter into said calculator digit and function specifying information on which a calculation is performed by said computation circuit;

a liquid crystal display unit, a liquid crystal composition being contained in said cavity, said liquid crystal display unit comprising a series of display elements, each element comprising first and second electrodes at least one of which is directly deposited on the extension of said one substrate;

a first connection directly deposited on said extension of said one substrate and disposed between said keyboard unit and said integrated circuit unit for transmission of said information from said keyboard unit to said integrated circuit unit;

and a second connection directly deposited on said extension of said one substrate and disposed between said integrated circuit and said display unit for displaying computation results derived from said integrated circuit unit on said display unit, whereby said substrate having an extension provides a structural support for all said integrated circuit unit, said display unit, said first connection and said second connection.

* * * * *